United States Patent [19]

Virshup

[11] Patent Number: 5,342,451
[45] Date of Patent: Aug. 30, 1994

[54] SEMICONDUCTOR OPTICAL POWER RECEIVER

[75] Inventor: Gary Virshup, Cupertino, Calif.

[73] Assignee: Varian Associates, Inc., Palo Alto, Calif.

[21] Appl. No.: 844,149

[22] Filed: Mar. 2, 1992

Related U.S. Application Data

[63] Continuation-in-part of Ser. No. 537,483, Jun. 7, 1990, abandoned.

[51] Int. Cl.$^5$ .................. H01L 31/05; H01L 31/068; H01L 31/0304
[52] U.S. Cl. .................................. 136/244; 136/255; 136/262; 136/249; 257/431; 257/443
[58] Field of Search ................. 136/244, 249 MS, 252, 136/255, 262; 257/431, 443

[56] References Cited

U.S. PATENT DOCUMENTS

| T102,801 | 3/1983 | Hovel | 136/255 |
|---|---|---|---|
| 3,081,370 | 3/1963 | Miller | 136/255 |
| 3,460,240 | 8/1969 | Tarneja et al. | 437/2 |
| 4,126,930 | 11/1978 | Moon | 437/5 |
| 4,131,486 | 12/1978 | Brandhorst, Jr. | 136/255 |
| 4,160,678 | 7/1979 | Jain et al. | 136/255 |
| 4,179,702 | 12/1979 | Lamorte | 357/30 |
| 4,259,959 | 2/1981 | Jebens | 136/244 |

FOREIGN PATENT DOCUMENTS

| 57-107078 | 7/1982 | Japan | 136/262 |
|---|---|---|---|
| 63-95680 | 4/1988 | Japan | 136/262 |

OTHER PUBLICATIONS

Request for Proposal, entitled "Monolithic, Series Connected, Multi-Junction Photovoltaic Power Converter Development," Jun. 19, 1989.

Fiber Optic Power Converter, Eide et al., *SPIE* vol. 1100 Sensor Fusion II (1989), pp. 27–31.

18.7% efficient (I-sun, AMO) large-area GaAs solar cells, Appl. Phys. Lett. 46 (8), Apr. 15, 1985, Werthen, et al, pp. 776–778.

High Efficiency InGaAsP Photovoltaic Power Converter, *IEEE Electron Device Letters*, vol. EDL-2, No. 2, Feb. 1981, Law et al., pp. 26–27.

A Monolithic Series-Connected Al.93Ga.07As/GaAs Solar Cell Array, 14th IEEE Photovoltaic Specialists Conf. 19800, pp. 554–562.

A Monolithic series-connected A10.93Ga0.07As/-GaAs solar cell array *Appl. Phys. Lett.* 35(7). Oct. 1, 1979, P. G. Borden, pp. 553–554.

A high-efficiency GaAlAs double-heterostructure photovoltaic detector *Apl. Phys. Lett.*, vol. 33, No. 8, Oct. 15, 1978, pp. 721–723.

Primary Examiner—Aaron Weisstuch
Attorney, Agent, or Firm—Poms, Smith, Lande & Rose

[57] ABSTRACT

A gallium-arsenide optical power receiver of the type having a pn junction formed over a substrate and buffer layer has a window layer of a first alloy of aluminum gallium arsenide ($Al_xGa_{1-x}As$) and a conductive layer of a second alloy of aluminum gallium arsenide ($Al_{1-x}Ga_xAs$). Alternatively, the gallium arsenide optical power receiver has a second window layer of the first alloy of aluminum gallium arsenide disposed on the conductive layer, and a cap layer of gallium arsenide disposed on the second window layer. The sheet resistance of the emitter layer is negated by being in parallel with the low sheet resistance of the conductive layer to minimize the thickness and conductivity of the emitter may therefore be optimized solely for energy conversion efficient.

50 Claims, 3 Drawing Sheets

SEMICONDUCTOR OPTICAL POWER RECEIVER

CROSS-REFERENCE TO RELATED APPLICATION

This application is a continuation-in-part of application Ser. No. 07/537,483, filed Jun. 7, 1990, subsequently abandoned.

FIELD OF THE INVENTION

The present invention relates generally to semiconductor devices which convert optical power into electrical power and, more particularly, to a semiconductor optical power receiver having an optically transparent electrically conducting semiconductor layer coextensively disposed on the window layer.

BACKGROUND OF THE INVENTION

A typical prior art semiconductor optical power receiver, or photocell, includes a pn junction formed between a base layer, which may typically be n-type, and an emitter layer, which may typically be p-type. The base layer is formed on an intrinsic substrate with a substantially thick buffer layer isolating the base layer from the substrate. The prior art optical power receiver further includes an optically transparent window layer on the emitter layer and a semiconductor cap layer formed on the window. A metallic grid to make electrical connection to the device is formed on the cap layer. The cap layer is then etched to expose the window layer except under the metallization of the grid. The cap layer provides isolation of the metallization from the pn junction with respect to self-doping of the semiconductor material from the metallization. Additionally, the cap layer provides for electrical conduction between the emitter and metallization.

When the optical energy is incident upon the emitter layer, the absorbed photons generate electrons and holes in the semiconductor material of the base and emitter layers. The number of carriers generated is dependent upon the wavelength of the radiation, thereby establishing the spectral response of the device. This spectral response is a function of the doping concentration of the base and emitter layers and also of their thicknesses.

The minority carriers generated in the base by the optical energy are collected across the pn junction. Once across the junction, such carriers become majority carriers and flow as an electrical current to the nearest grid line in the metallic grid. A disadvantage and limitation of the prior art device is the characteristic emitter sheet resistance of the emitter layer which causes a resistive loss associated with the passage of the current through the emitter to the grid. The grid lines of the metal grid need therefore be optimized to minimize the resistive loss without causing obscuration of the emitter layer to incident optical energy. For example, in optimizing the grid pattern, as the grid lines are spaced more closely together, the resistive losses are minimized. However, the optical obscuration increases until there is a complete loss of absorbed optical energy.

To further reduce the resistive losses, the sheet resistance of the emitter layer can also be reduced by increasing either the thickness of the emitter layer or its doping concentration. However, these parameters of the emitter layer affect the spectral response of the device as hereinabove discussed supra. Therefore, the enhancement of spectral response may increase emitter sheet resistance and, conversely, the minimization of emitter sheet resistance will degrade the spectral response according to the immediately hereinabove described techniques of the prior art. Accordingly, a primary disadvantage and limitation of prior art semiconductor optical power receivers is that their optimal design combines both optical and electrical efficiency.

SUMMARY OF THE INVENTION

It is therefore an object of the present invention to overcome one or more of the disadvantages and limitations of the prior art enumerated hereinabove.

A primary object of the present invention is to provide a novel structure for a semiconductor optical power receiver.

A further object of the present invention is to provide such a novel structure which has a higher optical to electrical conversion efficiency than prior art devices.

It is yet another object of the present invention to provide such a novel structure which minimizes emitter layer sheet resistance losses.

According to one form of the present invention, a novel semiconductor optical power receiver includes a base layer of a first semiconductor material having a first conductivity type, an emitter layer of the first semiconductor material having a second conductivity type opposite the first type to form a pn junction with said base layer, a window layer of a second semiconductor material of said second conductivity type disposed on said emitter layer, and a conducting layer of a third semiconductor material of said second conductivity type coextensively disposed on said window layer. Each of the second and third semiconductor materials is optically transparent to selected wavelengths of radiation. When such radiation is incident on the emitter layer, a voltage is developed between a first electrical contact in electrical communication with the base layer and a second electrical contact in electrical communication with the emitter layer and disposed on the conducting layer. The window layer is preferred but not essential.

In one aspect of the present invention, the window layer and the conducting layer are different alloys of the same semiconductor material. Furthermore, in another aspect of the present invention, the semiconductor material provided for the window layer and the conducting layer is an isotype of the first semiconductor material provided for the base and emitter layers. With this choice of materials, the semiconductor optical power receiver is readily fabricated with conventional crystal growth techniques and provides for a high quality lattice matching between layers. Similarly, in yet another aspect of the present invention, the base layer is formed on an intrinsic substrate with a relatively thick graded buffer layer therebetween. In one particular embodiment of the invention, each of the above layers may be grown, using known molecular beam epitaxy (MBE) techniques, from Gallium Arsenide (GaAs) with the isotype for the window and conducting layers being Aluminum Gallium Arsenide (AlGaAs). The alloys of the AlGaAs may then be $Al_xGa_{1-x}As$ and $Al_{1-x}Ga_xAs$ for the window layer and conducting layer, respectively. In one embodiment thereof, $x=0.8$. The Aluminum concentration in the conducting layer can range from 5% to 35% and still achieve relatively low sheet resistance, be optically transparent to the selected wavelengths of radiation and still allow narrow and spaced apart grid lines for current flow and transmission of incident light. Good ohmic contact can be made to the conducting layer of the present invention. A cap layer is not necessary to protect the conducting layer. The low Aluminum concentration in the conducting layer also gives greater effect to and permits higher doping in the conducting layer.

To increase optical to electrical energy conversion efficiency, several novel devices of the present invention may be readily fabricated on a single substrate layer. After all layers of the device are formed, a plurality of trench etches are made through all the layers on the substrate to separate the device into individual device sections. The device sections are metallized and connected in series. On a typical circular wafer, the trenches may be radially cut.

The conducting layer of the novel semiconductor optical power receiver, which will be described in greater detail hereinbelow in conjunction with an exemplary preferred embodiment of the present invention, accomplishes the above stated objects of the present invention. In the prior art, the cap layer is etched, except under the metallic grid, to expose the window layer. In the present invention, the conducting layer, being optically transparent to the intended wavelengths of incident radiation, is not etched after the metallic grid is placed thereon. Accordingly, the sheet resistance of the conducting layer is in parallel with the sheet resistance of the emitter layer. By making the conducting layer thicker or more heavily doped, the effective overall sheet resistance losses of the device are determined primarily by the sheet resistance of the conducting layer. Therefore, the thickness and doping concentration of the emitter layer can be optimized solely for spectral response, without degradation of spectral response from the conducting layer since it is transparent to photons having a wavelength in the desired device operating range.

Therefore, the device of the present invention has an advantageously higher optical to electrical energy conversion efficiency than the prior art device since the prior art device has higher sheet resistance when optimized for spectral response. Another advantage of the present invention is that the novel device may be made smaller without penalizing energy conversion efficiency. In the prior art devices, reducing the size of the device increased power loss due to high current densities in the emitter which is overcome by the minimization of device sheet resistance of the novel device. A further advantage of the device of the present invention is that a further gain in conversion efficiency may be achieved by optimizing the thickness and doping of the emitter layer for a narrower spectrum.

These and other objects, advantages and features of the present invention will become readily apparent to those skilled in the art from the following description of the exemplary preferred embodiment of the present invention when read in conjunction with the attached drawings and appended claims.

DESCRIPTION OF EXEMPLARY PREFERRED EMBODIMENTS

Figure 1:
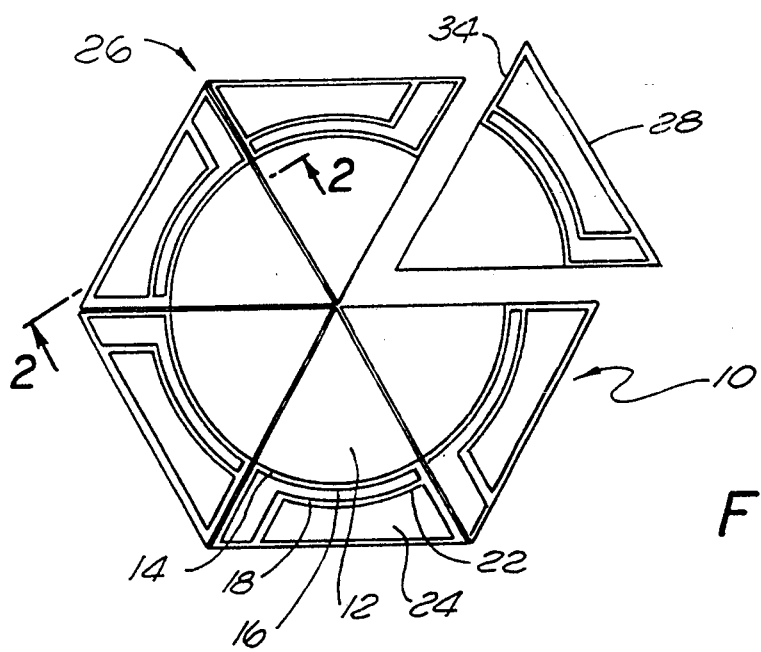
FIG. 1 is a plan view of one embodiment of a semiconductor optical power converter constructed according to the principles of the present invention.
Figure 2:
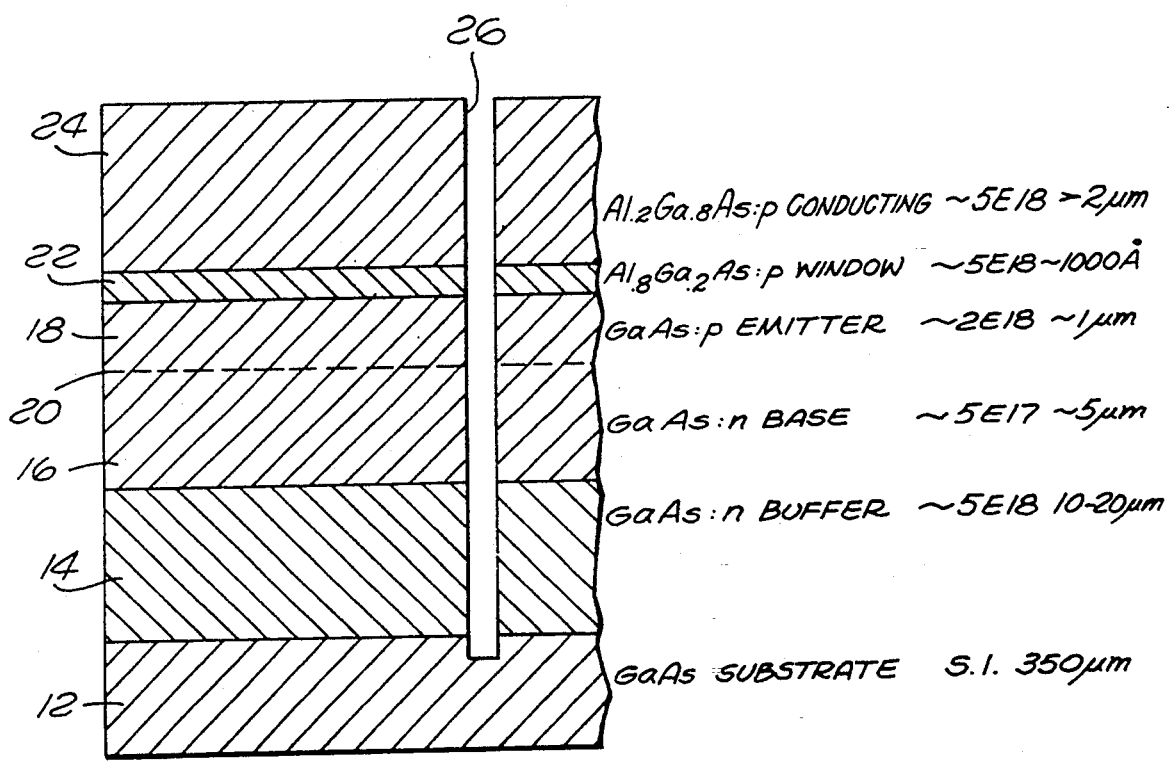
FIG. 2 is a cross-sectional view of the exemplary semiconductor optical power converter as taken along line 2—2 of FIG. 1.

Referring now to FIGS. 1 and 2, there is shown a semiconductor optical power converter 10 constructed in accordance with principles of the present invention. The power converter 10 includes a substrate 12, a buffer layer 14, a base layer 16 of a first semiconductor material having a first conductivity type, an emitter layer 18 of the first semiconductor material having a second conductivity type opposite the first conductivity type so that a pn junction 20 is formed with the base layer 16, a window layer 22 of a second semiconductor material having the same second conductivity type as emitter layer 18, and a conducting layer 24 of a third semiconductor material having the same second conductivity type as emitter layer 18 and window layer 22. Each of the second and third semiconductor material is optically transparent to selected wavelengths of radiation.

The buffer layer 14 is interposed between the substrate 12 and base layer 16 and is relatively thick as compared thereto. Each of the substrate 12 and buffer layer 14 may be formed from the first semiconductor material. Furthermore, the second and third semiconductor materials may be alloys of each other. If these alloys are also an isotype of the first semiconductor material, then the power converter 10 is readily fabricated by conventional crystal growth techniques with high quality lattice matching between each layer. Accordingly, the semiconductor materials and growth techniques for the power converter 10, as described in greater detail hereinbelow, are set forth only as an exemplary embodiment. Selections of materials or fabrication techniques different from those described below are also within the scope of the present invention.

In a preferred embodiment, the substrate 12 is formed from substantially intrinsic gallium arsenide and may have a thickness of approximately 350 microns. The buffer layer 14 is epitaxially grown on the substrate 12. The buffer layer 14 may be n-type gallium arsenide having a donor concentration of approximately $5 \times 10^{18}/cm^3$ and a thickness in the range of 10 to 20 microns. The base layer 16 is epitaxially grown on the buffer layer 14. The base layer 16 may also be of n-type gallium arsenide having a donor concentration of $5 \times 10^{17}/cm^3$ and a thickness of approximately 5 microns. The emitter layer 18 is epitaxially grown on the base layer 16. The emitter layer 18 may be of p-type gallium arsenide having an acceptor concentration of $2 \times 10^{18}/cm^3$ and a thickness of 1 micron. Accordingly, the pn junction 20 is formed between the base layer 16 and emitter layer 18.

Epitaxially grown on the emitter layer 18 is the window layer 22 of a first alloy of an isotype of GaAs, such as aluminum gallium arsenide, or, more particularly, $Al_xGa_{1-x}As$. The window layer 22 has the same p-type conductivity as the emitter layer 18. Aluminum gallium arsenide is selected because of its transparency to the selected wavelengths of radiation at which the device operates. The window layer 22 may have an acceptor concentration of $5 \times 10^{18}/cm^3$ and a thickness in the range of 1,000 angstroms.

The conducting layer 24 of a second alloy of aluminum gallium arsenide, such as $Al_{1-x}Ga_xAs$, is epitaxially grown on the window layer 22. The conducting layer 24 is also of p-type conductivity and is highly doped, for example to have an acceptor level of $5 \times 10^{18}/cm^3$. The acceptor level in the conducting layer may range from $5 \times 10^{17}/cm^3$ to $5 \times 10^{20}/cm^3$ using conventional techniques or even to $10^{21}/cm^3$ using atomic layer epitaxy. The higher acceptor levels can be achieved with the preferred Aluminum concentrations, thereby reducing the sheet resistance in the conducting layer. As discussed hereinabove, the thickness of the conducting layer 24 is chosen to be at least 2 microns, or twice the thickness of the emitter layer 18. In one embodiment of the present invention, the first and second alloys for the window layer 22 and conducting layer 24 may be determined by selecting x=0.8. Generally, the semiconductor material of the window and conducting layers is $Al_xGa_{1-x}As$, where x for the window layer is preferably 0.8 and x for the conducting layer is preferably 0.2.

The Aluminum concentration in the conducting layer can range from 5% to 35% and still be optically transparent to the selected wavelength of radiation. The low Aluminum concentration allows low sheet resistance in the conducting layer and also good ohmic contact for the grid lines. These characteristics become more important with increasing intensity levels of incident light, or higher power levels. With higher intensities of incident light, the lower sheet resistance in the conducting layer and the superior ohmic contact of the grid lines permits higher power output from the power converter and minimizes the loss of conduction through the conducting layer at the higher intensities.

Figure 6:
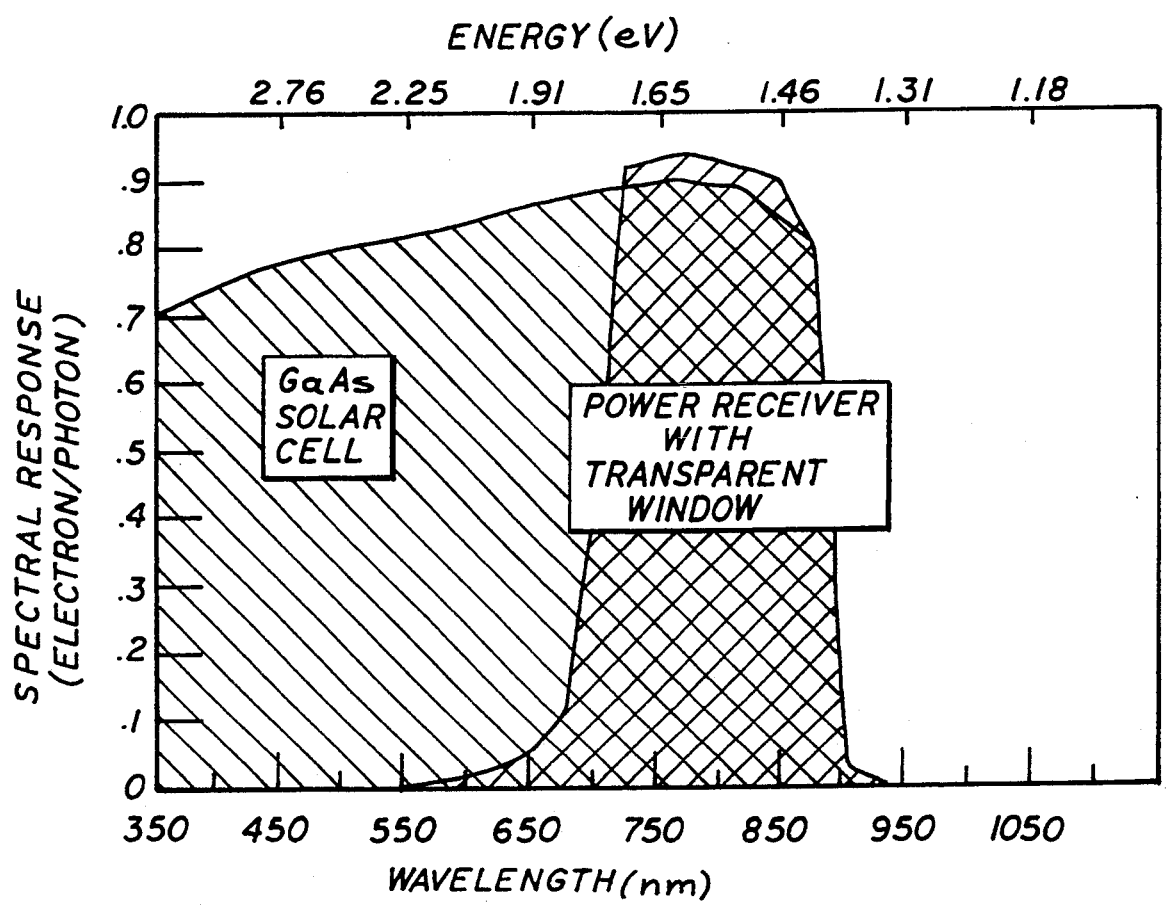
FIG. 6 is a spectral response curve for the power converter of the present invention as a function of wavelength of incident light and showing the energy band gaps applicable to the converter.

FIG. 6 shows the spectral response for a typical Gallium Arsenide solar cell in the single shaded portion extending into the double shaded portion. The spectral response of a typical Gallium Arsenide solar cell drops off to substantially zero at around 900 nanometers. This spectral response represents the energy band gap of the emitter and base of the power converter according to the present invention. The double shaded portion of the curve represents the spectral response of the power receiver as determined by the energy band gap of the conducting layer 24. (While FIG. 6 refers to a transparent "window" it should be understood that the double-shaded curve represents the characteristics resulting from the conducting layer.) The aluminum concentration in the conducting layer determines the left-hand edge of the band gap for the power receiver, and in the case where the aluminum concentration is approximately 20 percent, the left edge of the band is at approximately 700 nanometers. Therefore, for a light source of a selected wavelength, such as 850 nanometers, the power converter transmits the light through the conducting and window layers to be absorbed in the emitter or base layers while light substantially outside the window defined by the characteristics of the conducting layer, such as light at wavelengths substantially below 700 nanometers is not transmitted. Preferably, the energy band gap of the conducting layer is between 0.15 and 0.5 eV greater than the energy band gap of the emitter layer.

By dissociating the thickness and doping concentration of the emitter layer from that of the conducting layer, the emitter layer can be optimized solely for spectral response, without degrading the spectral response of the conducting layer, since the conducting layer is transparent to photons having a wavelength in the desired device operating range. In one preferred embodiment of the present invention where the aluminum concentration in the conducting layer is 20 percent, the doping in the conducting layer can be substantially raised such as to $5 \times 10^{18}/cm^3$ to increase the conduction in the conducting layer by decreasing the sheet resistance, thereby permitting parallel conduction in the conducting layer. The sheet resistance in the conducting layer is preferably reduced so that the grid lines forming the contacts on the conducting layer can be narrower and spread further apart to allow greater incidence of light on the conducting layer. By allowing increased incident light levels, the power converter can operate at increased power levels. The ability to operate at higher intensity levels results from the ability to arbitrarily reduce the sheet resistance in the conducting layer by increasing the thickness or doping. For example, at power levels of 100 milliwatts to over one watt, the conversion efficiency is approximately 50%. The invention allows for optimization of the sheet resistance of the conducting layer separate from the optimization of the emitter and base layers. The doping and thickness of the emitter and base layers may be optimized for a wavelength of incident light falling within 100 to 250 nanometers near (to the left of) the band gap of the material, to increase the spectral response of the converter as shown in FIG. 6.

Figure 5:
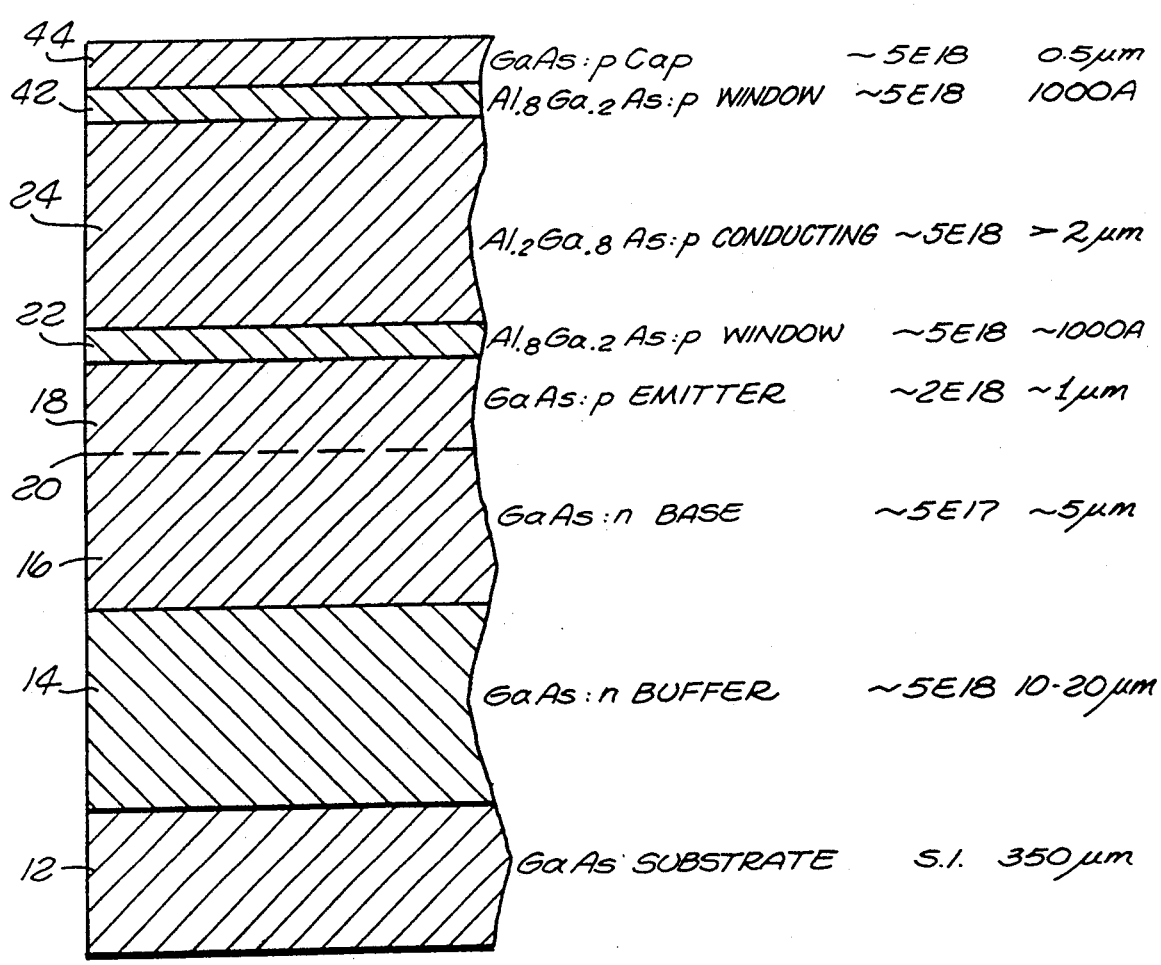
FIG. 5 is a cross-sectional view, similar to FIG. 2, of an alternative embodiment of a semiconductor optical power converter.

FIG. 6 also shows the energy band gaps corresponding to the power converter of FIGS. 2 and 5. In the preferred embodiment, the approximate energy band gap difference between the GaAs emitter and base layers and that for the conducting layer, at about the 50% level on the curve is approximately 0.31 eV. The energy band gap difference can range, for example, from 0.15–0.50 eV. However, in the preferred embodiment, the energy band gap for the conducting layer is approximately 0.30 eV higher than the energy band gap of the emitter layer.

Figure 7:
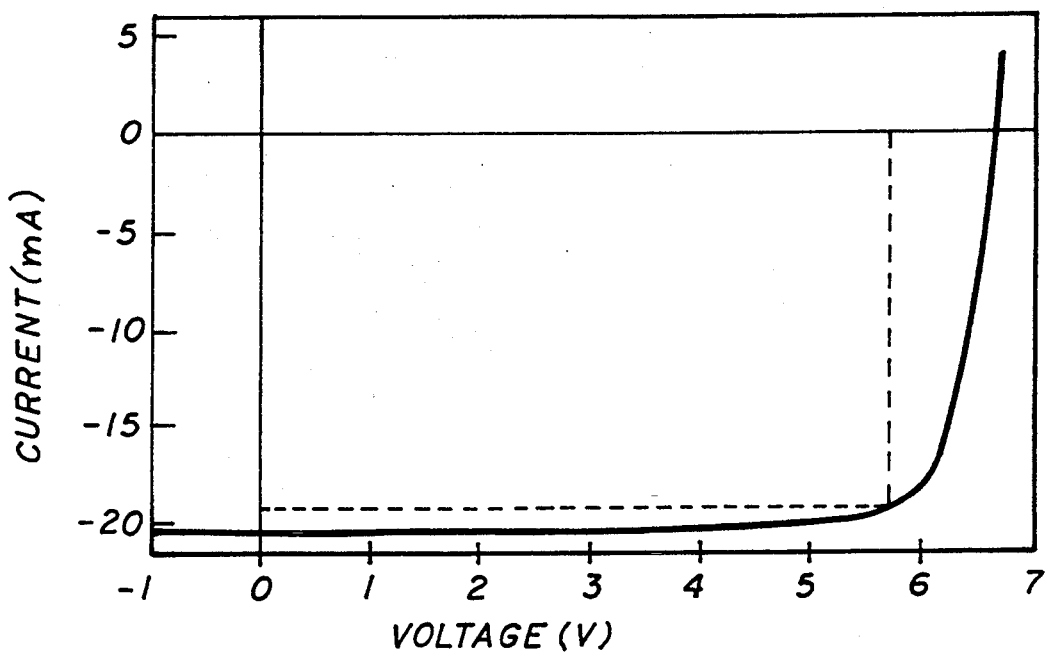
FIG. 7 is a current-voltage curve for the power converter of the present invention representing the efficiency characteristics of the converter.

FIG. 7 shows the conversion efficiency characteristics of a power converter according to the present invention. The efficiency obtained with a power converter according to the present invention is approximately 44.36%. The open circuit voltage is approximately 6,676 volts and the short circuit current is approximately 20.7 milliamps. The fill factor is approximately 80.88%. The incident energy at 820 nanometers is 250 milliwatts and the maximum output power is 110.8 milliwatts operating at 25° Centigrade. Current at maximum power is 19.4 milliamps and the voltage at maximum power is 5.7621 volts.

When optical energy is incident on the power converter 10, photons absorbed within the base layer 16 and emitter layer 18 will develop electron-hole pairs. The minority carriers in the base layer 16 then cross the pn junction 20 and are collected in the emitter layer 18 thereby developing a voltage across the pn junction 20. Electrical connection, as described in greater detail hereinbelow, is made to the power converter 10 to utilize the voltage developed across the pn junction 20.

To increase the optical to electrical energy conversion efficiency, several power converters 10 may be connected in series. For example, a plurality of trench etches 26 may be made to extend through each of the conducting layer 24, window layer 22, emitter layer 18, base layer 16, buffer layer 14 and partially extend into the substrate layer 12. The trench etches 26 form a plurality of radially disposed electrically isolated device sections 28 as best seen in FIG. 1. In each of the device sections 28 (or in a single power converter 10 without trench etches 26S) a first electrical contact 30 (FIG. 4) is disposed on the base layer 16 in each of the device sections 28 and a second electrical contact 32 is disposed on the conducting layer 24 to be in electrical communication with the emitter layer 18. Each of the first electrical contacts 30 associated with corresponding respective device sections 28, except for one of the first contacts 30 is electrically connected to an adjacent second electrical contact 32, such that the emitter layers 18 and base layers 16 are connected in series, with the connections being made as described in greater detail hereinbelow, around the circumference of the device. The power converter 10 then develops a voltage between the single remaining unconnected first electrical contact 30 and the single remaining unconnected second electrical contact 32 in response to the selected wavelength of optical radiation being incident on the conducting layer 24.

To make the first contact 30 on the base layer 16, an etch 34 is made through each of the conducting layer 24, window layer 22, and emitter layer 18 to expose a portion of the base layer 16 for each of the device sections 28 (or in a single power converter 10 without trench etches 26). Using known techniques, metallization is deposited and patterned within the first etch 34 to form the first electrical contact 30 on the exposed portion of the base layer 16. The second electrical contact 32 on the conducting layer 24 may be formed using the same metallization deposited for forming the first electrical contact 30. After the metallization is deposited, it may also be patterned to form the second electrical contact 32.

Figure 3:
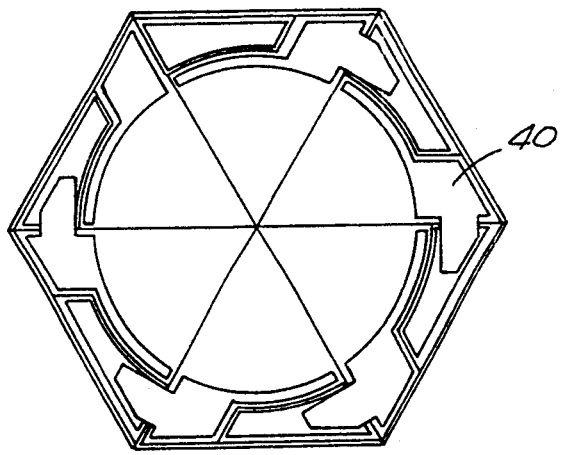
FIG. 3 is a view as in FIG. 1 with the addition of an air bridge interconnect metallization.
Figure 4:
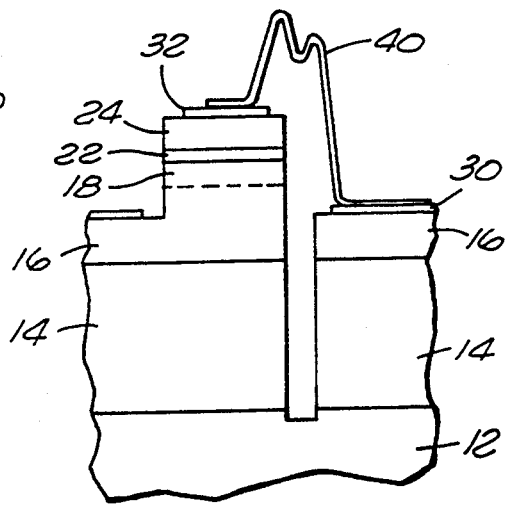
FIG. 4 is a detailed view of an exemplary air bridge.

With further reference to FIGS. 3 and 4, there is shown an air bridge metallization 40 which electrically connects the first electrical contact 30 at one of the device sections 28 to the second electrical contact 32 at an adjacent one of the device sections 28 as described above. To form the air bridge metallization 40, a first layer of photoresist is deposited on the surface of the power converter 10 after the first electrical contacts 30 and the second electrical contacts 32 are formed. The photoresist is developed and etched to expose all but one of each of the first electrical contacts 30 and the second electrical contacts 32 which are to be serially interconnected. A thin layer of metal is then deposited on the first photoresist layer, by conventional techniques. A second layer of photoresist is then deposited above this thin layer of metal, then developed and etched to expose areas which will have the air bridge metallization 40. The exposed areas of the second photoresist layer are then plated by additional metal. Removing the first and second photoresist layers leaves the air bridge metallization 40 interconnecting the electrical contacts 30 and the second electrical contacts 32, as shown in FIGS. 3 and 4. Although the number of device sections 28 is exemplarily shown as six with five air bridge metallizations 40, any number of device sections 28 is contemplated by the present invention.

An alternative embodiment of the semiconductor optical power converter 10, as shown in FIG. 5, further comprises a second window layer 42 of the first alloy of aluminum gallium arsenide, such as $Al_xGa_{1-x}As$. The second window layer 42 has the same p-type conductivity as the conducting layer 24, and is epitaxially grown on the conducting layer 24. The second window layer may have an acceptor concentration of $5 \times 10^{18}/cm^3$ and a thickness of 1,000 angstroms. The alloy for the second window layer 42 may be determined by selecting $x=0.8$. Epitaxially grown on the second window layer 42 is a cap layer 44 of p-type gallium arsenide having an acceptor concentration of $5 \times 10^{18}/cm^3$ and a thickness of 0.5 microns. The cap layer 44 is used to reduce the contact resistance between the second electrical contact 32 and the second window layer 42, and is removed everywhere except under the second electrical contact 32.

There has been described hereinabove a novel optical power receiver and an exemplary preferred embodiment of the present invention. It is apparent that those skilled in the art may now make numerous uses of and departures from the above described embodiment without departing from the inventive concepts disclosed herein. Accordingly, the present invention is to be defined solely by the scope of the following claims.

I claim:

1. A semiconductor optical power receiver comprising:

a base layer of a semiconductor material of a first conductivity type;

an emitter layer of a semiconductor material of a second conductivity type opposite said first conductivity type and adjacent said base layer to form a junction region therebetween and having an emitter layer energy band gap;

a conducting layer of a semiconductor material of a first alloy of AlGaAs having an aluminum concentration no greater than 35% and of said second conductivity type above the emitter layer and having a conducting layer band gap no greater than approximately 0.3 eV higher than the emitter layer band gap;

a first electrical contact in electrical communication with said base layer; and a second electrical contact disposed on said conducting layer in electrical communication with said emitter layer, said optical power receiver developing voltage between said first contact and said second contact in response to selected wavelengths of radiation being incident on said emitter layer.

2. An optical power receiver as set forth in claim 1 wherein said material of the first conductivity type is gallium arsenide.

3. An optical power receiver as set forth in claim 1 wherein said first conductivity type is n-type.

4. An optical power receiver as set forth in claim 1 wherein said semiconductor material of the conducting layer is a first alloy of $Al_xGa_{1-x}As$.

5. An optical power receiver as set forth in claim 4 wherein said first alloy is determined by $x=0.2$.

6. An optical power receiver as set forth in claim 1 wherein said base layer has a thickness of substantially 5 microns.

7. An optical power receiver as set forth in claim 1 wherein said emitter layer has a thickness of substantially 1 micron.

8. An optical power receiver as set forth in claim 1 further comprising a window layer of a semiconductor material of the second conductivity type disposed on the emitter layer and below the conducting layer and transparent to selected wavelengths of radiation and wherein said window layer has a thickness of substantially 1,000 angstroms.

9. An optical power receiver as set forth in claim 1 wherein said conducting layer has a thickness of at least 2 microns.

10. An optical power receiver as set forth in claim 1 wherein said base layer has a donor impurity level of substantially $5 \times 10^{17}/cm^3$.

11. An optical power receiver as set forth in claim 1 wherein said emitter layer has an acceptor impurity level of substantially $2 \times 10^{18}/cm^3$.

12. An optical power receiver as set forth in claim 1 further comprising a window layer of a semiconductor material of the second conductivity type disposed on the emitter layer and below the conducting layer and transparent to selected wavelengths of radiation and wherein said window layer has an acceptor impurity level of substantially $5 \times 10^{18}/cm^3$.

13. An optical power receiver as set forth in claim 1 wherein said conducting layer has an acceptor impurity level of substantially $5 \times 10^{18}/cm^3$.

14. An optical power receiver as set forth in claim 1 further comprising:
a substrate layer of the semiconductor material of the first conductivity type having substantially intrinsic conductivity; and
a buffer layer of the semiconductor material of the first conductivity type interposed between said base layer and said substrate.

15. An optical power receiver as set forth in claim 14 wherein said buffer layer has a donor impurity level of substantially $5 \times 10^{18}/cm^3$.

16. An optical power receiver as set forth in claim 14 wherein said buffer layer has a thickness in the range of 10–20 microns.

17. An optical power receiver as set forth in claim 14 wherein said substrate has a thickness of substantially 350 microns.

18. A semiconductor optical power receiver comprising:
a base layer of a first semiconductor material of a first conductivity type;
an emitter layer of said first semiconductor material of a second conductivity type opposite said first conductivity type and adjacent said base layer to form a junction region therebetween;
a window layer of a first alloy of a second semiconductor material of said second conductivity type disposed on said emitter layer, said first alloy being transparent to selected wavelengths of radiation;
a conducting layer of a second alloy of said second semiconductor material of said second conductivity type coextensively disposed on said window layer;
a first electrical contact in electrical communication with said base layer;
a second electrical contact in electrical communication with said emitter layer, said optical power receiver developing voltage between said first contact and said second contact in response to said selected wavelengths of radiation being incident on said emitter layer;

a second window layer of said first alloy of said second semiconductor material of said second conductivity type disposed on said conducting layer; and
a cap layer of said first semiconductor material of said second conductivity type disposed on said second window layer, said second electrical contact being disposed on said cap layer.

19. An optical power receiver as set forth in claim 18 wherein said second window layer has a thickness of substantially 1,000 angstroms.

20. An optical power receiver as set forth in claim 18 wherein said cap layer has a thickness of substantially 0.5 microns.

21. An optical power receiver as set forth in claim 18 wherein said second window layer has an acceptor impurity level of substantially $5 \times 10^{18}/cm^3$.

22. An optical power receiver as set forth in claim 18 wherein said cap layer has an acceptor impurity level of substantially $5 \times 10^{18}/cm^3$.

23. A semiconductor optical power receiver comprising:
a substrate of a first semiconductor material having substantially intrinsic conductivity;
a plurality of spaced-apart buffer layers of said first semiconductor material of a first conductivity type disposed on said substrate;
a plurality of base layers of said first semiconductor material of said first conductivity type, each of said base layers being disposed on a respective one of said spaced-apart buffer layers;
a plurality of emitter layers of said first semiconductor material of a second conductivity type opposite said first conductivity type, each of said emitter layers being disposed on a respective one of said base layers to form a junction region therebetween and having an emitter layer energy band gap;
a plurality of window layers of a first alloy of a second semiconductor material of said second conductivity type, each of said window layers being disposed on a respective one of said emitter layers, said second semiconductor material being transparent to selected wavelengths of radiation;
a plurality of conducting layers of a second alloy of said second semiconductor material of said second conductivity type, each of said conducting layers being disposed on a respective one of said window layers and having conducting layer band gaps no greater than approximately 0.3 eV higher than the emitter layer band gap;
a plurality of first electrical contacts, each of said first contacts being in electrical communication with a respective one of said base layers;
a plurality of second electrical contacts, each of said second contacts being disposed on a respective one of said conducting layers in electrical communication with one of said emitter layers; and
means for electrically connecting in series each one of said first electrical contacts with a respective one of said second electrical contacts, said optical power receiver developing a voltage between a remaining unconnected one of said first electrical contacts and a remaining unconnected one of said second electrical contacts in response to said selected wavelengths of radiation being incident on said conducting layers.

24. An optical power receiver as set forth in claim 23 wherein said connecting means includes:

a first etched area through each of said conducting layers, said window layers and said emitter layers to expose a portion of each of said base layers;

a first metallization within said first etched area electrically contacting said portion of each of said base layers and forming said first electrical contacts;

a second metallization associated with and electrically contacting each of said conducting layers and forming said second electrical contacts; and an air bridge metallization electrically connecting said first metallization at one of said base layers to said second metallization at one of said conducting layers wherein the emitter layer associated therewith has a different junction from said one of said base layers.

25. A semiconductor optical power receiver comprising:

a substrate of a first semiconductor material of a substantially intrinsic conductivity type;

a plurality of spaced apart buffer layers of said first semiconductor material of a first conductivity type disposed on said substrate;

a plurality of base layers of said first semiconductor material of said first conductivity type, each of said base layers being disposed on a respective one of said buffer layers;

a plurality of emitter layers of said first semiconductor material of a second conductivity type opposite said first conductivity type, each of said emitter layers being disposed on a respective one of said base layers to form a junction region therebetween;

a plurality of window layers of a first alloy of a second semiconductor material of said second conductivity type, each of said window layers being disposed on a respective one of said emitter layers, said second semiconductor material being transparent to selected wavelengths of radiation;

a plurality of conducting layers of a second alloy of said second semiconductor material of said second conductivity type, each of said conducting layers being disposed on a respective one of said window layers;

a plurality of first electrical contacts, each of said first contacts being in electrical communication with a respective one of said base layers;

a plurality of second electrical contacts, each of said second contacts being in electrical communication with a respective one of said emitter layers;

means for electrically connecting in series each but one of said first electrical contacts with a respective one of said second electrical contacts, said optical power receiver developing a voltage between a remaining unconnected one of said first electrical contacts and a remaining unconnected one of said second electrical contacts in response to said selected wavelengths of radiation being incident on said conducting layers;

a plurality of second window layers of said first alloy of said second semiconductor material of said second conductivity type disposed on said plurality of said conducting layers; and a plurality of cap layers of said first semiconductor material of said second conductivity type disposed on said plurality of said second window layers, each of said second contacts being disposed on a respective one of said cap layers.

26. An optical power receiver as set forth in claim 25 wherein said plurality of second window layers have a thickness of substantially 1,000 angstroms.

27. An optical power receiver as set forth in claim 25 wherein said plurality of cap layers have a thickness of substantially 0.5 microns.

28. An optical power receiver as set forth in claim 25 wherein said plurality of second window layers have an acceptor impurity level of substantially $5 \times 10^{18}/cm^3$.

29. An optical power receiver as set forth in claim 25 wherein said plurality of cap layers have an acceptor impurity level of substantially $5 \times 10^{18}/cm^3$.

30. A semiconductor optical power receiver comprising:

a substrate layer of a first semiconductor material of substantially intrinsic conductivity type;

a buffer layer of said first semiconductor material of a first conductivity type epitaxially grown on said substrate;

a base layer of said first semiconductor material of said first conductivity type epitaxially grown on said buffer layer;

an emitter layer of said first semiconductor material of a second conductivity type opposite said first conductivity type epitaxially grown on said base layer to form a junction region therebetween and having an energy band gap;

a window layer of a first alloy of a second semiconductor material of said second conductivity type epitaxially grown on said emitter layer, said second semiconductor material being transparent to selected wavelengths of radiation;

a conducting layer of a second alloy of said second semiconductor material of said second conductivity type epitaxially grown on said window layer and having an energy band gap approximately 0.3 eV above the emitter layer energy band gap;

a plurality of trench etches extending through each of said conducting layer, said window layer, said emitter layer, said base layer and said buffer layer, and further partially extending into said substrate layer to form a plurality of electrically isolated device sections;

a first electrical contact in electrical communication with said base layer within each of said sections;

a second electrical contact disposed on said conducting layer in electrical communication with said emitter layers within each of said sections; and means for electrically connecting in series each but one first electrical contact to a respective adjacent second electrical contacts, said device developing a voltage between a remaining unconnected one of said first contacts and a remaining unconnected one of said second contacts in response to selected wavelengths of radiation being incident on said conducting layer.

31. An optical power receiver as set forth in claim 30 wherein said connecting means includes:

a first etch through each of said conducting layer, said window layer, and said emitter layer to expose a portion of said base layer for each of said device sections;

a first metallization within said etch electrically contacting said portion of said base layer and forming said first electrical contact;

a second metallization electrically contacting said conducting layer for each of said device sections and forming said second electrical contact; and an air bridge metallization electrically connecting said first electrical contact at one of said device sections to said second electrical contact at a different one of said device sections.

32. An optical power receiver as set forth in claim 31 wherein said trench etches are radially disposed within said device.

33. A semiconductor optical power receiver comprising:
- a base layer of a first semiconductor material having a first conductivity type;
- an emitter layer of said first semiconductor material having a second conductivity type opposite said first type to form a pn junction with said base layer and further having an energy band gap;
- a window layer of a second semiconductor material having said second conductivity type disposed on said emitter layer;
- a conducting layer of a third semiconductor material having said second conductivity type coextensively disposed on said window layer and having an energy band gap approximately 0.3 eV above the emitter layer band gap;
- a first electrical contact in electrical communication with said base layer; and
- a second electrical contact disposed on said conducting layer is electrical communication with said emitter layer, said optical power receiver developing a voltage between said first contact and said second contact in response to selected wavelengths of radiation being incident on said emitter layer.

34. An optical power receiver as set forth in claim 33 wherein said second semiconductor material and said third semiconductor material are alloys of each other.

35. An optical power receiver as set forth in claim 33 wherein said second semiconductor material and said third semiconductor material are isotypes of said first semiconductor material.

36. A semiconductor optical power receiver comprising:
- a base layer of a semiconductor material of a first conductivity type;
- an emitter layer of a semiconductor material of a second conductivity type opposite said first conductivity type having an emitter layer sheet resistance and adjacent said base layer to form a junction region therebetween;
- a conducting layer of an alloy of a semiconductor material of said second conductivity type above said emitter layer said conducting layer having an aluminum concentration no greater than 35%;
- a first electrical contact in electrical communication with said base layer; and
- a second electrical contact disposed on said conducting layer in electrical communication with said emitter layer, said optical power receiver developing voltage between said first contact and said second contact in response to said selected wavelengths of radiation being incident on said emitter layer.

37. A Semiconductor optical power receiver comprising:
- a base layer of a semiconductor material of a first conductivity type;
- an emitter layer of a semiconductor material of a second conductivity type opposite said first conductivity type having an emitter layer sheet resistance and adjacent said base layer to form a junction region therebetween;
- a conducting layer of an alloy of a semiconductor material of said second conductivity type above said emitter layer, said conducting layer having an aluminum concentration no greater than approximately 35%;
- a first electrical contact in electrical communication with said base layer;
- a second electrical contact disposed on said conducting layer in electrical communication with said emitter layer, said optical power receiver developing voltage between said first contact and said second contact in response to said selected wavelengths of radiation being incident on said emitter layer; and
- a window layer between the emitter layer and the conducting layer of a first alloy of a semiconductor material of said second conductivity type, said semiconductor material of the window layer having a band gap above selected wavelengths of radiation.

38. The receiver of claim 37 wherein the base layer comprises a first semiconductor material, the emitter layer is formed from the first semiconductor material and the window layer comprises a second semiconductor material of said second conductivity type.

39. The receiver of claim 38 wherein the sheet resistance of the conducting layer is about one fifth the sheet resistance of the emitter layer.

40. A semiconductor optical power receiver comprising:
- a base layer of a first semiconductor material of a first conductivity type;
- an emitter layer of said first semiconductor material of a second conductivity type opposite said first conductivity type and having an emitter layer sheet resistance, and adjacent said base layer to form a junction region therebetween;
- a window layer of a first alloy of a second semiconductor material of said second conductivity type disposed on said emitter layer, said second material being transparent to selected wavelengths of radiation;
- a conducting layer of a second alloy of said second semiconductor material of said second conductivity type above said emitter layer and on said window layer, said conducting layer having a sheet resistance less than the sheet resistance of said emitter layer and having an alloyed aluminum concentration of no greater than approximately 35%;
- a first electrical contact in electrical communication with said base layer; and
- a second electrical contact disposed on said conducting layer in electrical communication with said emitter layer, said optical power receiver developing voltage between said first contact and said second contact in response to selected wavelengths of radiation being incident on said emitter layer.

41. An optical power receiver as set forth in claim 40 wherein said first material is gallium arsenide.

42. An optical power receiver as set forth in claim 40 wherein said first conductivity type is n-type.

43. An optical power receiver as set forth in claim 40 wherein said second material is $Al_xGa_{1-x}As$.

44. An optical power receiver as set forth in claim 43 wherein said first alloy is determined by $x=0.8$.

45. An optical power receiver as set forth in claim 43 wherein said second alloy is determined by x=0.2.

46. An optical power receiver as set forth in claim 40 wherein said emitter layer has a thickness of substantially 1 micron.

47. An optical power receiver as set forth in claim 40 wherein said window layer has a thickness of substantially 1,000 angstroms.

48. An optical power receiver as set forth in claim 40 wherein said conducting layer has a thickness of at least 2 microns.

49. An optical power receiver as set forth in claim 40 wherein said emitter layer has an acceptor impurity level of substantially $2\times 10^{18}/cm^3$.

50. An optical power receiver as set forth in claim 40 wherein said conducting layer has an acceptor impurity level of at least approximately $5\times 10^{18}/cm^3$.

* * * * *